United States Patent
Chih et al.

(10) Patent No.: US 10,276,227 B2
(45) Date of Patent: Apr. 30, 2019

(54) WRITE ALGORITHM FOR MEMORY TO REDUCE FAILURE RATE OF WRITE OPERATIONS

(71) Applicant: Taiwan Semiconductor Manufacturing Company Limited, Hsinchu (TW)

(72) Inventors: Yu-Der Chih, Hsinchu (TW); Chien-Ye Lee, Hsinchu (TW); Jenn-Jou Wu, Hsinchu (TW); Yi-Chieh Chiu, Taipei (TW); Yi-Chun Shih, Taipei (TW); William J. Gallagher, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/581,097

(22) Filed: Apr. 28, 2017

(65) Prior Publication Data
US 2018/0315464 A1    Nov. 1, 2018

(51) Int. Cl.
*G11C 11/16*    (2006.01)
(52) U.S. Cl.
CPC ........ *G11C 11/1677* (2013.01); *G11C 11/161* (2013.01); *G11C 11/1673* (2013.01); *G11C 11/1675* (2013.01)
(58) Field of Classification Search
CPC .............. G11C 11/1677; G11C 11/161; G11C 11/1673; G11C 11/1675; G11C 11/22; G11C 11/16

USPC ....................................................... 365/158
See application file for complete search history.

(56) References Cited

U.S. PATENT DOCUMENTS

| 2013/0051164 A1* | 2/2013 | Chang ................. G11C 11/5685 365/189.16 |
| 2015/0006796 A1* | 1/2015 | Takeuchi ............ G06F 12/0246 711/103 |

* cited by examiner

*Primary Examiner* — Alexander Sofocleous
*Assistant Examiner* — Alfredo Bermudez Lozada
(74) *Attorney, Agent, or Firm* — Jones Day

(57) ABSTRACT

A method for verifying a write operation in a memory cell (e.g., a non-volatile memory cell) that includes performing a first read operation of the memory cell to measure a first current associated with the memory cell and comparing the measured first current associated with the memory cell to a first predetermined threshold current to determine whether the write operation changed the state of the memory cell. If the measured first current associated with the memory cell indicates the write operation did change the state of the memory cell the method further includes performing a second read operation of the memory cell to measure a second current associated with the memory cell and comparing the measured second current associated with the memory cell to a second predetermined threshold current to determine whether the write operation changed the state of the memory cell to the desired state or an intermediate state.

20 Claims, 5 Drawing Sheets

WRITE ALGORITHM FOR MEMORY TO REDUCE FAILURE RATE OF WRITE OPERATIONS

TECHNICAL FIELD

This relates to semiconductor memory devices and more particularly to write algorithms for memory including non-volatile memory devices such as spin-transfer torque magnetic random access memory (STT-MRAM) devices to reduce the failure rate of write operations.

BACKGROUND

Magnetic random access memory (MRAM) is a type of random access memory (RAM) in which data is stored in magnetic storage elements rather than as an electric charge. To write data to a storage element of an MRAM, the write operation reverses the polarity within the magnetic layer. The change in polarity is a continuous operation with intermediate states. To confirm the write operation is successful, the write operation may include a verification step to in confirm that the storage element transitions to the desired state. Existing verification methods result in undesirable failure rates for write operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
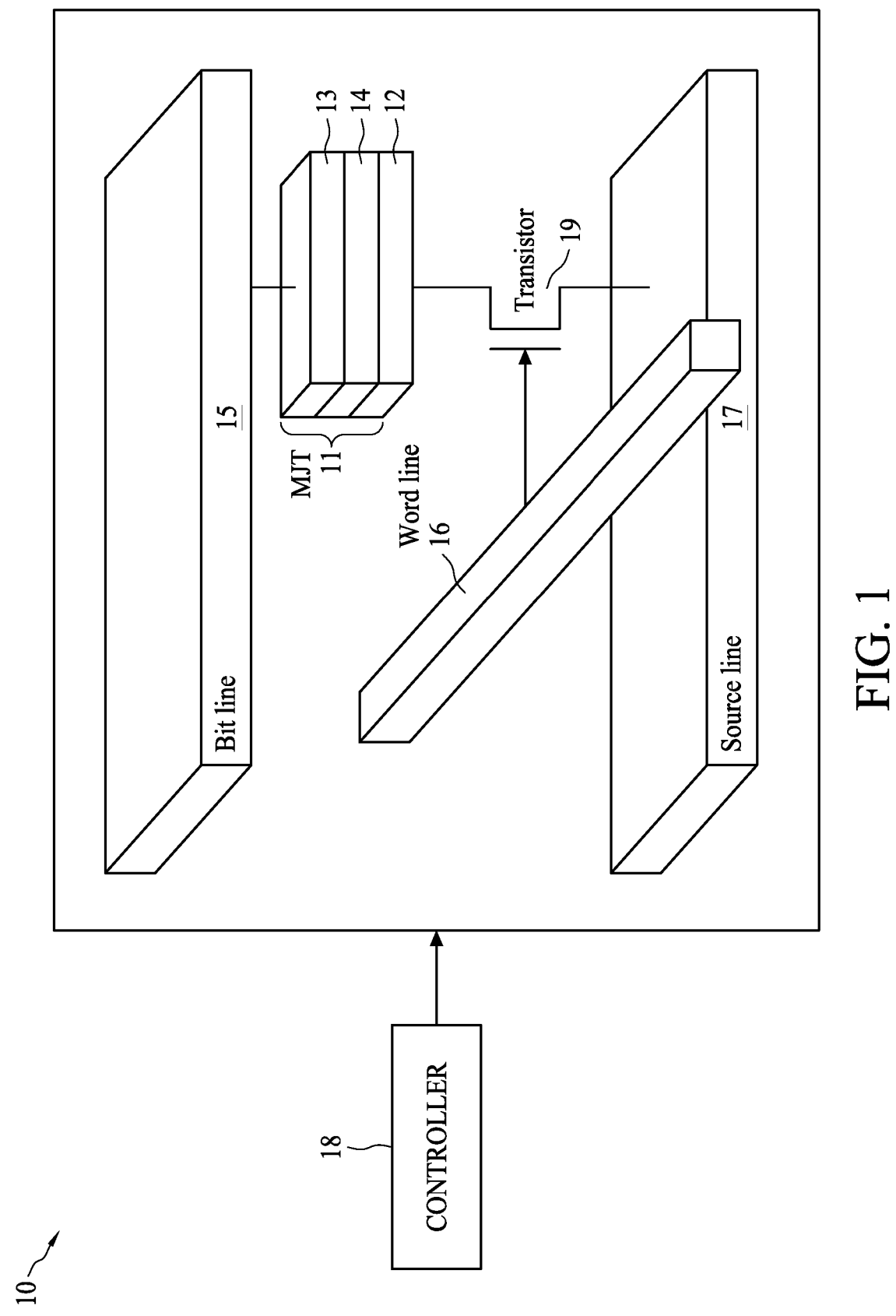
FIG. 1 is a schematic diagram illustrating an example of a non-volatile memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram illustrating an example of a non-volatile memory device in accordance with some embodiments. In FIG. 1, the non-volatile memory device is a spin-transfer torque magnetic random access memory (STT-MRAM) device 10. The STT-MRAM device 10 is a semiconductor memory device in which data is stored in magnetic storage elements. In an STT-MRAM 10, the cell or magnetic storage element is called a magnetic tunnel junction (MTJ) 11 and a current is used to write data to the cell 11 which causes a spin-polarized current to be generated in the MTJ 11. In some embodiments, the cell 11 may be made up of a fixed layer of ferromagnetic material 12, a free layer of ferromagnetic material 13, and a barrier (insulating) layer 14 located between the fixed and free layer. The polarity of the fixed layer 12 may be fixed and the polarity of the free layer 13 may be configured to change depending on the application of a current (e.g., a current with a particular direction and magnitude) at e.g., the bit line 15. When the polarity of the free layer 13 and the fixed layer 12 are the same, the resistance across the MTJ 11 is relatively low ($R_P$) and when the polarity of the two layers are opposite one another, the resistance of the MTJ 11 is relatively high ($R_{AP}$). The measure of resistance (or associated current) can be used during a read operation to read the data from the cell 11. For example, in some embodiments, the controller 18 may be configured to utilize the bit line 15, word line 16, and source line 17 to apply a voltage across the MTJ 11 and measure a corresponding current across the MTJ 11 (i.e., selectively apply a voltage across MTJ 11 using bit line 15 and word line 16 and then measuring the resulting current at the source line 17). The transistor 19 coupled to word line 16 may be utilized as a switch to select the individual MTJ 11 and couple it to source line 17. In this manner, the controller 18 is able to determine the resistance (e.g., relative resistance) of the MTJ 11. In some embodiments, the ratio of the two resistances ($R_P$ and $R_{AP}$) is large enough such that $R_P$ can be read as a logical low value and $R_{AP}$ can be read as a logical high value.

While the polarity of the free layer 13 can be changed during a cell write operation, the write-error rate for an STT-MRAM 10 is not zero. Since the polarity of the free layer 13 changes in a continuous manner when switching from one polarity to another, there is an intermediate state in which the polarity of the free layer 13 is partially the same as the polarity of the fixed layer 12 and partially the opposite of the polarity of the fixed layer 12. As a result, the resistance of the cell 11 is greater than $R_P$ but less than $R_{AP}$. STT-MRAM devices 10 sometimes suffer from an intermediate state effect in which the cell 11 of interest reaches the intermediate state between $R_P$ and $R_{AP}$ and then either returns to its original state or stays in the intermediate state instead of completely switching states. The intermediate state may be temporarily stable for some period of time before the cell settles into one or the other logical state.

Accordingly, a verification procedure may be implemented as part of the write algorithm to determine if data written to a particular cell 11 needs to be rewritten. In some embodiments, the verification procedure may include two read operations—a normal read operation and a margin read operation.

In some embodiments, the normal read operation may be configured to determine whether the cell 11 returned to its original state. For example, in the situation where the cell 11 switches from $R_{AP}$ to $R_P$, the normal read operation may measure a current across the cell 11 after a cell write operation. If the current exceeds a predetermined threshold current, that may indicate that the resistance of the cell 11 is close to $R_P$ (i.e., the resistance is relatively low) and that the cell 11 did not return to the $R_{AP}$ state after the cell write operation.

However, in the case of a write operation from $R_{AP}$ to $R_P$, the resistance (R) of the intermediate state may be close to the resistance $R_P$. As a result, the current measurement during the normal read operation may not be reliable (e.g., high) enough to determine whether the cell 11 switched to the $R_P$ state or if the cell 11 remained in an intermediate state. For example, the threshold current may not be set high enough to distinguish between these two situations. Accordingly, the normal read operation may not be sensitive enough to determine whether the cell 11 is in an intermediate state or the $R_P$ state.

By increasing the threshold current, the margin read operation can be configured to be sensitive enough to determine whether the cell 11 is in an intermediate state of an $R_P$ state. In particular, by setting the threshold current for the read operation higher than the threshold current in the normal read operation, the margin read operation may have sufficient resolution to determine whether the cell of interest is in an intermediate state or an $R_P$ state.

Write algorithms described herein may, in some embodiments, achieve a reduction in write errors while maintaining other desirable performance characteristics of the memory devices described herein. In some embodiments, the write algorithms may be controlled by a controller such as the controller 18 illustrated in FIG. 1. For example, the controller 18 may selectively apply a current/voltage to the bit line 15 (relative to source line 17) using the combination of the bit line 15 and the word line 16 to select the desired MTJ 11. Depending on current/voltage applied to the MTJ 11, the polarity of the free layer 13 may be maintained or changed.

Figure 2:
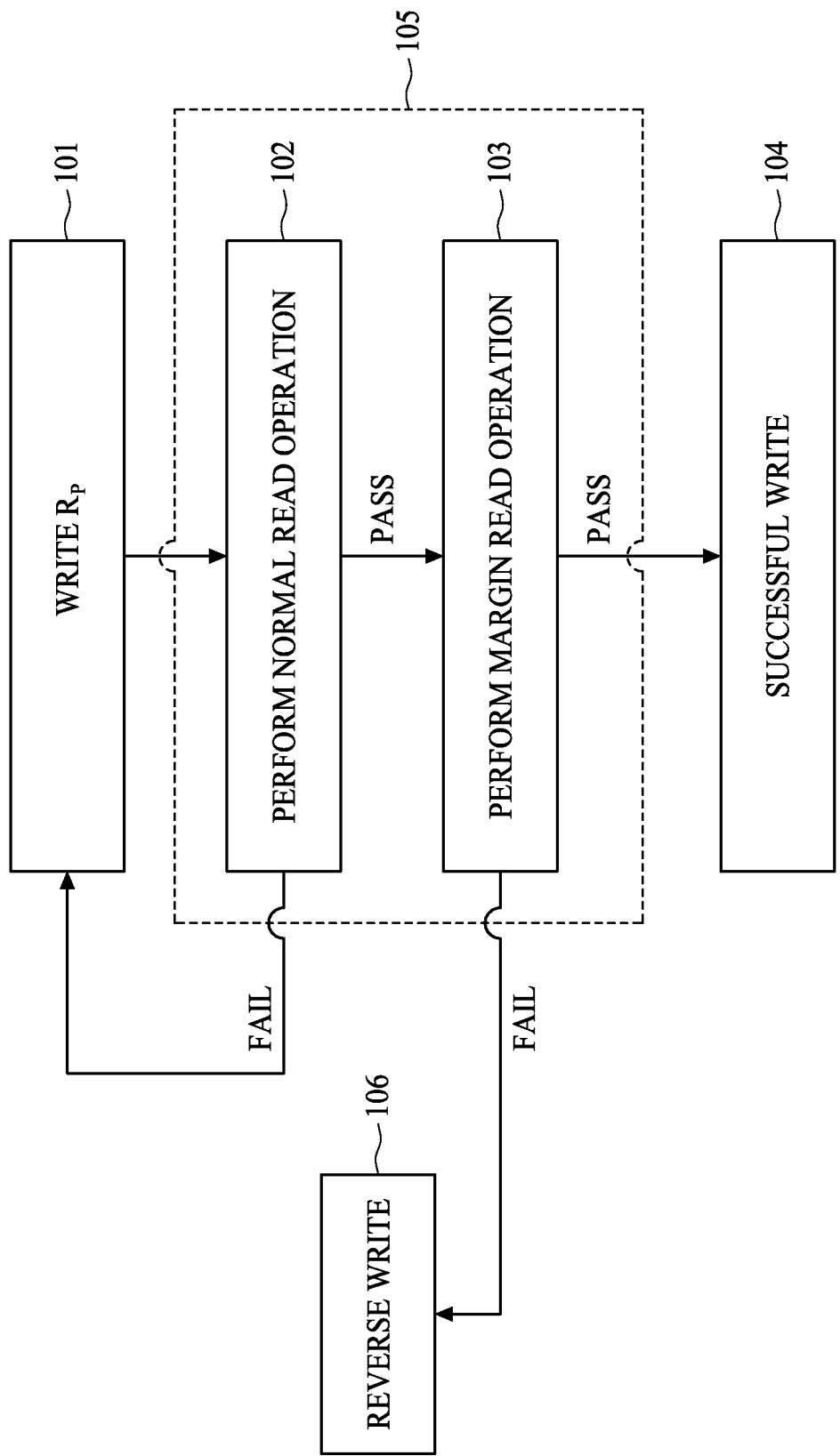
FIG. 2 is a flow chart illustrating the operation of a first example of a write algorithm in accordance with some embodiments.

FIG. 2 is a flow chart illustrating the operation of a first example of a write algorithm in accordance with some embodiments. As illustrated, the write algorithm shown in FIG. 2 includes a two-level verification procedure 105 including two read operations—a normal read operation 102 and a margin read operation 103. The write algorithm illustrated in FIG. 2 begins at operation 101 where a cell write operation is performed to change the state of the cell 11 from $R_{AP}$ to $R_P$. At operation 102, a normal read operation is performed to verify whether the cell write operation 101 was successful. As discussed above, the normal read operation may include reading the data in the cell 11 to determine whether a measured current exceeds a predetermined threshold current. If the measured current does not exceed the threshold current, the cell write operation 101 is determined to be unsuccessful (e.g., the cell 11 remained in the $R_{AP}$ state) and the cell write operation 101 is attempted again. However, if the measured current does exceed the predetermined threshold current, the cell 11 is deemed to pass the normal read operation. This result indicates that the cell 11 is either in an intermediate state or the desired $R_P$ state.

After passing the normal read operation test at operation 102, a margin read operation test is performed at operation 103 to determine whether the cell 11 is in an intermediate state or the $R_P$ state. As indicated above, the margin read operation is similar to the normal read operation except the threshold current is higher (e.g., higher than the expected current measurement associated with the intermediate state) in the margin read operation. If the measured current in the margin read operation exceeds the predetermined threshold current that indicates the $R_P$ state was successfully written to the cell 11 and the write operation is successful at operation 104. However, if the measured current is less than the predetermined threshold current, this may indicate that the cell 11 is in an intermediate state. In this case, the cell 11 may be returned to the $R_P$ state with a reverse write (i.e., a write operation to return the cell to the $R_{AP}$ state) at operation 106. In some embodiments, if the cell 11 is determined to be in an intermediate state, it may be more efficient to return the cell 11 to the initial state (e.g., $R_{AP}$) before performing the write operation again instead of merely attempting to rewrite a cell 11 that is in an intermediate state.

Accordingly, the two step verification procedure provides a first step that determines whether the cell 11 needs to be rewritten and a second step that determines whether the cell 11 needs to be returned to its initial state and then rewritten. The two step procedure is more efficient because the reverse write operation is not performed in the case of all failures. If only the second step were performed, all failures would include a step of returning the cell 11 to its initial state, even if such a procedure was not required. This would increase the overall write time (on average) since all failures would require a reverse write operation followed by a write operation.

Figure 3:
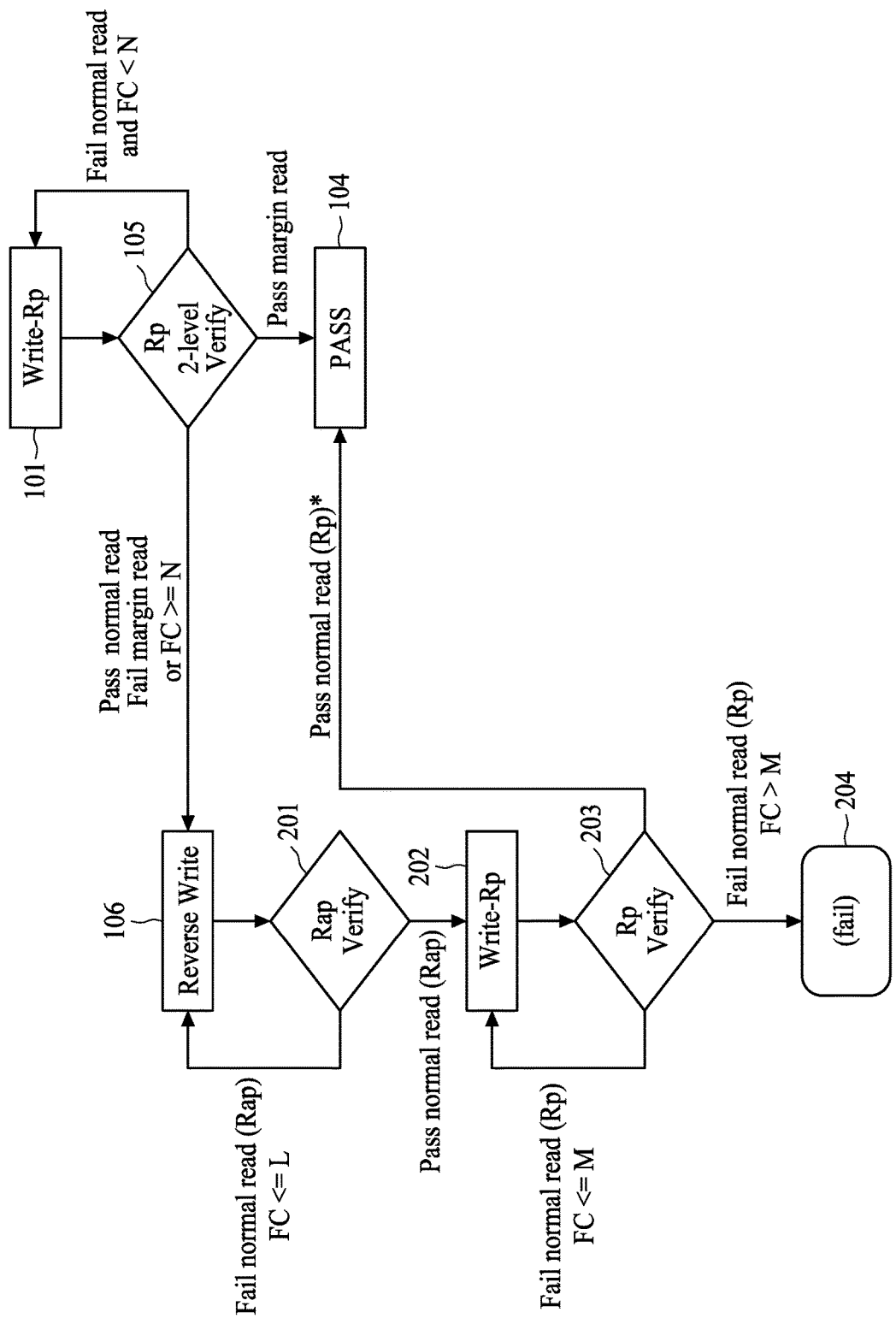
FIG. 3 is a flow chart illustrating the operation of a second example of a write algorithm in accordance with some embodiments.

FIG. 3 is a flow chart illustrating the operation of a second example of a write algorithm in accordance with some embodiments. The write algorithm illustrated in FIG. 3 begins at operation 101 where a cell write operation is performed to change the state of the cell 11 from $R_{AP}$ to $R_P$. Next, at operation 105, the two-level verification operation is performed. The two-level verification operation is discussed above in connection with FIG. 2. If the cell 11 passes the normal read operation 102 and margin read operation 103 that make up the two-level verification 105, the write algorithm determines that the cell write operation 101 is successful at operation 104. However, if the cell 11 fails the two-level write operation 105, the algorithm continues. If the failure occurs during the normal read operation 102 portion of the two level write operation 105, the write operation returns to operation 101 where the data is written to the cell 11 again. In some embodiments, two level write operation 105 may be executed more than once (e.g., N times) and the process may only return to the cell write operation 101 if the failure count (FC) is less than N. In other words, the write operation may only perform a cell write operation in response to a normal read operation failure a maximum of N times.

If the cell 11 fails the two-level verification operation 105 because it passes the normal read operation 102 but fails the margin read operation 103 (or the FC from the normal read operation is greater than or equal to N), the process continues to operation 106 where the write operation is reversed (i.e., the previous value is rewritten to the cell) such that the cell 11 is returned to the $R_{AP}$ state.

Next, in operation 201, the write operation may verify that the cell 11 is in a R state. In some embodiments, this verification at operation 201 may be a normal read operation as discussed above. In some embodiments, the verification operation to conclude whether the cell 11 is in an $R_{AP}$ state, may be performed up to a maximum of L times and the process may only return to the reverse write operation 106 if the failure count (FC) is less than or equal to L. Otherwise, the write process may proceed to operation 202 as if the cell 11 passed the verification operation 201. In some embodiments, the verification in operation 201 may not be performed more than once or may not be performed at all.

In operation 202, the $R_P$ state is written to the cell 11 and in operation 203, the $R_P$ value is verified with another normal read operation. If the cell 11 passes the normal read operation 203, the cell write operation 101, 202 illustrated in FIG. 3 is deemed successful and the algorithm concludes in operation 104. However, if the cell 11 fails the normal read operation in operation 203 and the failure count (FC) is greater than M, the cell write operation 101, 202 in FIG. 3 is deemed unsuccessful at operation 204. As illustrated, operation 202 may be repeated as many as M times before proceeding to operation 204. In exemplary embodiments, the values of L, M, and N may be selected such that the two-step procedure remains efficient while ensuring that the data stored in the cells is accurately stored. For example, in some embodiments, if the value of L, M, and N are selected to be too large, the verification procedure may take additional time but not yield more accurate write operations. If this is the case, the values of one or more of L, M, and N may be reduced to improve the efficiency of the process without significantly affecting the accuracy of the write operations.

As illustrated in FIG. 3, in some embodiments, it may not be desirable to perform the margin read operation 103 again at verification operation 203. In some embodiments, this may be because the probability of a cell 11 being in an intermediate state twice is substantially lower than the probability of the cell 11 being in an intermediate state only once. Accordingly, in some embodiments, a second margin read operation 103 may not be necessary.

Figure 4:
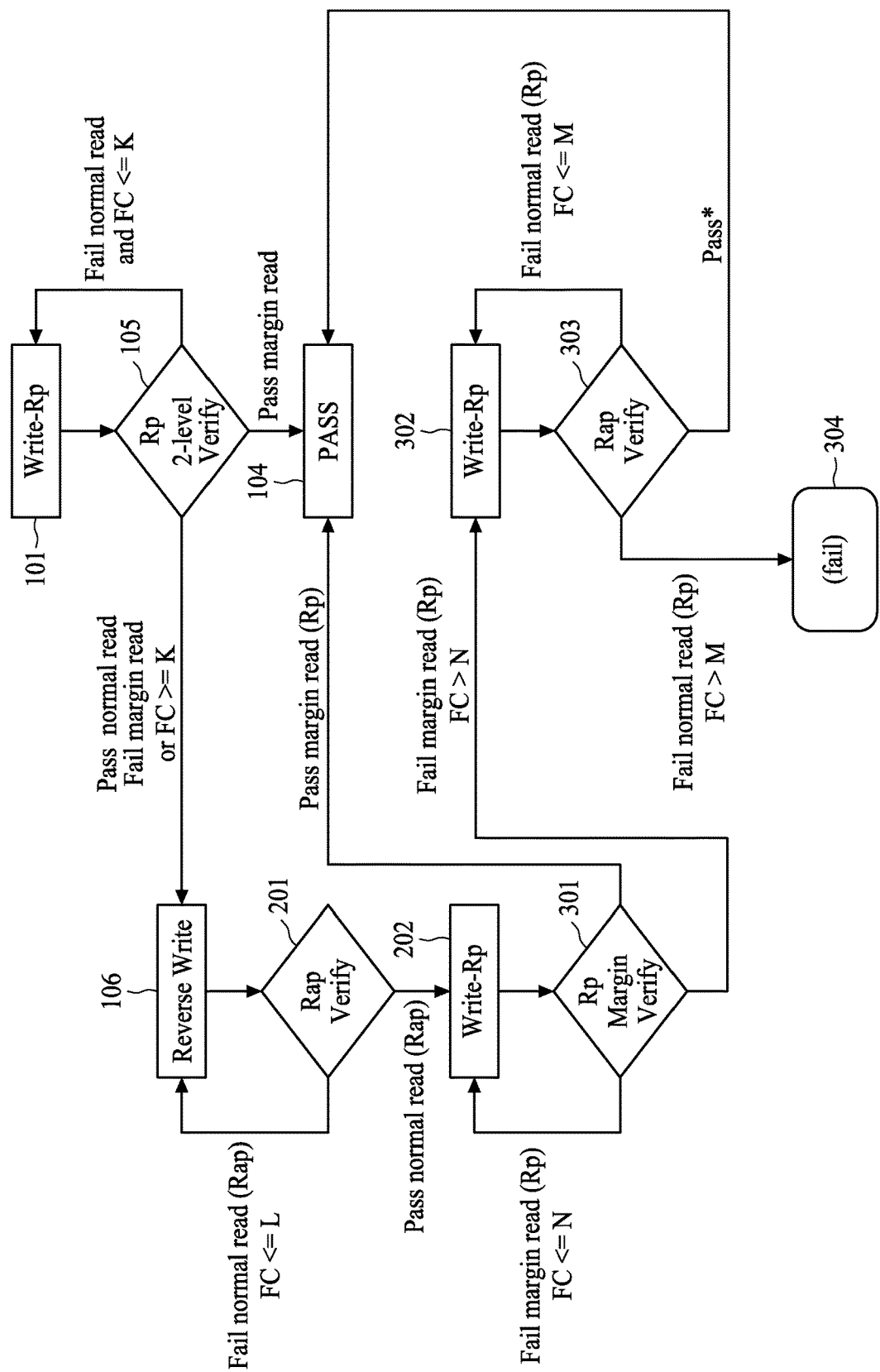
FIG. 4 is a flow chart illustrating the operation of a third example of a write algorithm in accordance with some embodiments.

FIG. 4 is a flow chart illustrating the operation of a third example of a write algorithm in accordance with some embodiments. Like FIG. 3, the write algorithm illustrated in FIG. 4 begins at operation 101 where a cell write operation 101 is performed to change the state of the cell 11 from $R_{AP}$ to $R_P$. Next, at operation 105, the two-level verification operation is performed. The two-level verification operation is discussed above in connection with FIG. 2. If the cell 11 passes the normal read operation 102 and margin read operation 103 that make up the two-level verification 105, the cell write operation 101 is deemed successful at operation 104. However, if the cell 11 fails the two-level write operation 105, the write algorithm continues. In particular, if the cell 11 fails the two-level write operation 105 during the normal read operation 102, the write operation returns to operation 101 where the cell write operation writes the data to the cell 11 again. In some embodiments, two level write operation 105 may be executed more than once (e.g., K times) and the process may only return to the cell write operation 101 if the failure count (FC) is less than K. In other words, the write operation may only perform a cell write operation in response to a normal read operation failure a maximum of K times. In exemplary embodiments, the value of K may be selected such that the two-step procedure remains efficient while ensuring that the data stored in the cells is accurately stored. For example, in some embodiments, if the value of K is selected to be too large, the verification procedure may take additional time but not yield more accurate write operations. If this is the case, the value of K may be reduced to improve the efficiency of the process without significantly affecting the accuracy of the write operations.

If the cell 11 fails the two-level verification operation 105 because it passes the normal read operation 102 but fails the margin read operation 103 (or the FC from the normal read operation is greater than or equal to K), the process continues to operation 106 where the write operation is reversed such that the cell 11 is returned to the $R_{AP}$ state.

Next, in operation 201, the write operation may verify that the cell 11 is in a $R_{AP}$ state. In some embodiments, this verification at operation 201 may be a normal read operation as discussed above. In some embodiments, the verification operation to conclude whether the cell 11 is in an $R_{AP}$ state, may be performed up to a maximum of L times and the process may only return to the reverse write operation 106 if the failure count (FC) is less than or equal to L. Otherwise, the write process may proceed to operation 202 as if the cell 11 passed the verification operation 201. In some embodiments, the verification in operation 201 may not be performed more than once or may not be performed at all.

In operation 202, the $R_P$ state is written to the cell 11 and in operation 301, the $R_P$ value is verified with a margin read operation. If the cell 11 passes the margin read operation 301, the cell write operation 101, 202 illustrated in FIG. 4 is deemed successful at operation 104. However, if the cell 11 fails the margin read operation in operation 301 and the failure count (FC) is greater than N, the write algorithm in FIG. 4 proceeds to cell write operation 302 where the $R_P$ state is written to the cell 11 again. As illustrated, operation 202 may be repeated as many as N times before proceeding to operation 302. Next, in operation 303, the value of the cell 11 is verified using a normal read operation 303. If the cell 11 passes the normal read operation 303, the cell write operation 101, 202, 302 is deemed a success at operation 104. However, if the cell 11 fails the normal read operation in operation 303 and the failure count (FC) that is greater than M, the cell write operation 101, 202, 302 is deemed unsuccessful at operation 304. As illustrated, operation 302 may be repeated as many as M times before proceeding to operation 304.

As illustrated in FIG. 4, in some embodiments, the margin read operation may be performed multiple times. In some embodiments, this approach may be desirable in situations where write errors are more frequent.

Figure 5:
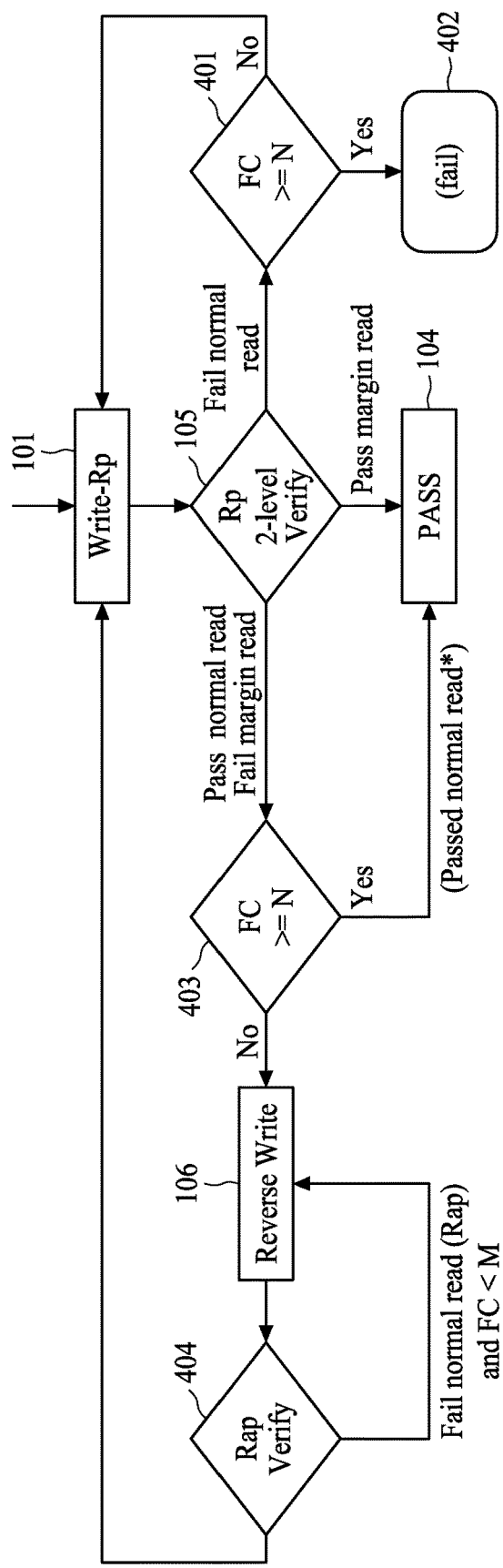
FIG. 5 is a flow chart illustrating the operation of a fourth example of a write algorithm in accordance with some embodiments.

FIG. 5 is a flow chart illustrating the operation of a fourth example of a write algorithm in accordance with some embodiments. In FIG. 5, multiple two-level verification operations 105 are performed as part of the write algorithm. The write algorithm illustrated in FIG. 5 begins at operation 101 where a cell write operation is performed to change the state of the cell 11 from $R_{AP}$ to $R_P$. Next, at operation 105, the two-level verification operation 105 is performed. The two-level verification operation 105 is discussed above in connection with FIG. 2. If the cell 11 passes the normal read operation 102 and margin read operation 103 that make up the two-level verification 105, the cell write operation 101 is deemed successful at operation 104. However, if the cell 11 fails the two-level write operation 105 during the normal read operation 102, the write operation returns to operation 101 where the cell write operation writes the data to the cell 11 again if, at operation 401, the write operation process determines the failure count (FC) is not greater than or equal to a threshold value N. If the cell 11 fails the normal read operation more than N times, the cell write operation 101 is deemed unsuccessful and the write algorithm concludes at operation 402.

If the cell 11 fails the two-level verification operation 105 because it passes the normal read operation 102 but fails the margin read operation 103 and the failure count (FC) is not greater than or equal to N (see operation 403), the process continues to operation 106 where the write operation is reversed such that the cell 11 is returned to the $R_{AP}$ state. If the failure count (FC) is greater than or equal to N, the cell write operation 101 is deemed unsuccessful at operation 402.

Next, in operation 404, the write operation may verify that the cell 11 is in a $R_{AP}$ state. In some embodiments, this verification may be a normal read operation as discussed above. In some embodiments, the verification may be performed up to a maximum of M times and the process may only return to the reverse write operation 106 if the failure count (FC) is less than M. Otherwise, the write process may proceed back to operation 101 where the $R_P$ state is written to the cell 11 again so that the two-level verification operation 105 can be performed again. In some embodiments, the verification in operation 404 may not be performed more than once or may not be performed at all.

Some embodiments described herein may include a method for verifying a write operation in memory cell (e.g., a non-volatile memory cell) that includes performing a first read operation of the non-volatile memory cell to measure a first current associated with the non-volatile memory cell and comparing the measured first current associated with the non-volatile memory cell to a first predetermined threshold current to determine whether the write operation changed the state of the non-volatile memory cell. If the measured first current associated with the non-volatile memory cell indicates the write operation did change the state of the non-volatile memory cell the method further includes performing a second read operation of the non-volatile memory cell to measure a second current associated with the non-volatile memory cell and comparing the measured second current associated with the non-volatile memory cell to a second predetermined threshold current to determine whether the write operation changed the state of the non-volatile memory cell to the desired state or an intermediate state.

Some embodiments described herein may include a method for writing data to a memory cell (e.g., a non-volatile memory cell) comprising applying a suitable current to the non-volatile memory cell to change the resistance of the non-volatile memory cell from a first resistance to a second resistance. The method may further include performing a first read operation of the non-volatile memory cell and determining whether the write operation changed the resistance of the non-volatile memory cell. If the first read operation indicates the write operation did change the resistance of the non-volatile memory cell, the method may further include performing a second read operation of the non-volatile memory cell and determining whether the write operation changed the resistance of the non-volatile memory cell to the second resistance or an intermediate resistance.

Some embodiments described herein may include a method for writing data to a memory cell (e.g., a non-volatile memory cell) comprising writing data to the non-volatile memory cell to change the resistance of the cell from a relatively high resistance to a relatively low resistance and performing a two-level verification procedure. The two-level verification procedure may include a first step to determine whether the non-volatile memory cell needs to be rewritten and a second step to determine whether the cell needs to be returned to its initial state and then rewritten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for verifying a write operation in a memory cell comprising:
    performing a first read operation of the memory cell to measure a first current associated with the memory cell;
    comparing the measured first current associated with the memory cell to a first predetermined threshold current to determine whether the write operation changed a state of the memory cell;
    when the measured first current associated with the memory cell indicates the write operation did change the state of the memory cell, performing a second read operation of the memory cell to measure a second current associated with the memory cell; and
    comparing the measured second current associated with the memory cell to a second predetermined threshold current to determine whether the write operation changed the state of the memory cell to a desired state or an intermediate state;
    wherein the memory cell is returned to an original state before the write operation is repeated if the measured second current is less than the second predetermined threshold current.

2. The method of claim 1, wherein the first read and comparison of the measured first current operation is to determine whether the memory cell is to be rewritten; and the second read and comparison of the measured second current operation is to determine whether the cell is to be returned to its initial state and then rewritten.

3. The method of claim 1, further comprising repeating the write operation if the measured first current associated with the memory cell indicates the write operation did not change the state of the memory cell.

4. The method of claim 1, further comprising returning the memory cell to an original state before repeating the write operation if the measured second current associated with the memory cell indicates the write operation changed the state of the memory cell to the intermediate state.

5. The method of claim 1, wherein the write operation is repeated if the measured first current is less than the first predetermined threshold current.

6. The method of claim 1, wherein the write operation is configured to change the memory cell from a high resistance state to a low resistance state.

7. The method of claim 1, wherein the second predetermined threshold current is more than first predetermined threshold current.

8. The method of claim 1, wherein the memory cell includes a magnetic tunnel junction (MTJ).

9. The method of claim 1, wherein the memory cell is part of a spin-transfer torque magnetic random access memory (STT-MRAM).

10. A method for verifying a write operation in a memory cell to change the resistance of the memory cell from a first resistance to a second resistance, comprising:
    performing a first read operation of the memory cell;
    determining whether a write operation changed the resistance of the memory cell;
    performing a second read operation of the memory cell, if the first read operation indicates the write operation did change the resistance of the memory cell; and
    determining whether the write operation changed the resistance of the memory cell to the second resistance or an intermediate resistance;

returning the memory cell to an original state before the write operation is repeated if the resistance of the memory cell is less than the second resistance.

11. The method of claim 10, further comprising reapplying current if the write operation did not change the resistance of the memory cell.

12. The method of claim 10, further comprising returning the memory cell to the first resistance before reapplying a spin polarized current if the write operation changed the resistance of the memory cell to the intermediate resistance.

13. The method of claim 10, wherein determining whether the write operation changed the resistance of the memory cell is based on a measurement of a first current relative to a first predetermined threshold current.

14. The method of claim 13, wherein determining whether the write operation changed the resistance of the memory cell to the second resistance or an intermediate resistance is based on a measurement of a second current relative to a second predetermined threshold current.

15. The method of claim 14, wherein the second predetermined threshold current is more than first predetermined threshold current.

16. The method of claim 10, wherein the first resistance is a high resistance state and the second resistance is a low resistance state.

17. The method of claim 10, wherein the memory cell includes a magnetic tunnel junction (MTJ) and the memory cell is part of a spin-transfer torque magnetic random access memory (STT-MRAM).

18. A method for verifying a write operation in a memory cell comprising:

performing a first read operation of the memory cell to measure a first current associated with the memory cell;

comparing the measured first current associated with the memory cell to a first predetermined threshold current to determine whether the write operation changed a state of the memory cell;

when the measured first current associated with the memory cell indicates the write operation did change the state of the memory cell, performing a second read operation of the memory cell to measure a second current associated with the memory cell; and comparing the measured second current associated with the memory cell to a second predetermined threshold current to determine whether the write operation changed the state of the memory cell to a desired state or an intermediate state;

wherein the memory cell is part of a spin-transfer torque magnetic random access memory (STT-MRAM).

19. The method of claim 18, wherein the memory cell is returned to an original state before the write operation is repeated if the measured second current is less than the second predetermined threshold current.

20. The method of claim 18, wherein the first read and comparison of the measured first current operation is to determine whether the memory cell is to be rewritten; and the second read and comparison of the measured second current operation is to determine whether the cell is to be returned to its initial state and then rewritten.

* * * * *